(12) United States Patent
Jang

(10) Patent No.: US 7,840,831 B2
(45) Date of Patent: Nov. 23, 2010

(54) METHODS OF REDUCING SKEW BETWEEN MULTIPHASE SIGNALS AND RELATED PHASE CORRECTION CIRCUITS

(75) Inventor: Young-Chan Jang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 828 days.

(21) Appl. No.: 11/739,389

(22) Filed: Apr. 24, 2007

(65) Prior Publication Data

US 2008/0036509 A1 Feb. 14, 2008

(30) Foreign Application Priority Data

Aug. 10, 2006 (KR) ...................... 10-2006-0075730

(51) Int. Cl.
*G06F 1/00* (2006.01)
*H03K 3/017* (2006.01)

(52) U.S. Cl. .................... 713/500; 327/65; 327/175; 327/354; 327/355

(58) Field of Classification Search ................. 713/500; 327/65, 175, 354, 355

See application file for complete search history.

(56) References Cited

U.S. PATENT DOCUMENTS

| 6,642,868 B1* | 11/2003 | Brown et al. ................. 341/120 |
| 6,861,886 B1* | 3/2005 | Ludden et al. ............... 327/156 |
| 6,960,950 B2* | 11/2005 | Shah et al. ................... 327/161 |
| 7,307,461 B2* | 12/2007 | Nguyen et al. ............... 327/172 |
| 7,612,592 B2* | 11/2009 | Parikh ........................ 327/175 |
| 2004/0161068 A1* | 8/2004 | Zerbe et al. .................. 375/355 |
| 2005/0007168 A1* | 1/2005 | Park et al. .................... 327/175 |
| 2005/0035789 A1* | 2/2005 | Tamura et al. ................ 327/65 |
| 2005/0058233 A1* | 3/2005 | Nguyen et al. ............... 375/354 |
| 2005/0108600 A1* | 5/2005 | Arguelles .................... 714/701 |
| 2005/0264338 A1* | 12/2005 | Berkram et al. ............. 327/291 |
| 2006/0274874 A1* | 12/2006 | Kumar et al. ................ 375/362 |
| 2007/0247960 A1* | 10/2007 | Minzoni et al. ............. 365/233 |

FOREIGN PATENT DOCUMENTS

| KR | 1989-10660 | 8/1989 |
| KR | 1020020056258 A | 7/2002 |
| KR | 1020040059273 A | 7/2004 |

\* cited by examiner

*Primary Examiner*—Vincent T Tran
(74) *Attorney, Agent, or Firm*—Myers Bigel Sibley & Sajovec

(57) ABSTRACT

Phase correction circuits and methods for reducing phase skew between multiphase clock signals and a semiconductor device including the circuit are provided. The semiconductor device includes a phase correction circuit and an output buffer. The phase correction circuit corrects phase skew between multiphase clock signals and generates skew-corrected clock signals. The output buffer outputs data in synchronization with the skew-corrected clock signals. The phase correction circuit includes a phase corrector, a replication output buffer, a phase detector, and a controller. The phase corrector corrects a duty cycle of a first clock signal, a duty cycle of a second clock signal, and phase skew between the first and second clock signals and generates skew-corrected first and second clock signals. The replication output buffer has the same structure as a data output buffer and outputs replication data in synchronization with the skew-corrected first and second clock signals. The phase detector detects a phase error in data output from the replication output buffer and generates a detection signal. The controller controls the phase corrector in response to the detection signal. Accordingly, phase skew between multiphase clock signals can be reduced or eliminated.

25 Claims, 9 Drawing Sheets

METHODS OF REDUCING SKEW BETWEEN MULTIPHASE SIGNALS AND RELATED PHASE CORRECTION CIRCUITS

CROSS-REFERENCE TO RELATED PATENT APPLICATION

This application claims the benefit under 35 U.S.C. §119 of Korean Patent Application No. 10-2006-0075730, filed on Aug. 10, 2006, in the Korean Intellectual Property Office, the disclosure of which is incorporated herein in its entirety by reference.

FIELD OF THE INVENTION

The present invention relates to electronic circuits, and more particularly, to phase correction circuits and methods.

BACKGROUND OF THE INVENTION

Synchronous semiconductor devices input and output data in synchronization with a clock signal. Such synchronous semiconductor devices may include a clock signal generator which generates an internal clock signal that is synchronized with an external clock signal.

When a semiconductor device inputs and outputs 4 bits or symbols of data per data input/output terminal during a single clock cycle, the semiconductor device includes a quadrature-phase signal generator which generates a quadrature-phase (i.e., multiphase) clock signal having a 90-degree phase difference from an external clock signal. Two or more multiphase signals may be needed. Multiphase signals may provide a high-speed interface to a semiconductor integrated circuit device so long as an unacceptable level of skew does not exist between the multiphase signals.

FIGS. 1 and 2 illustrate multiphase signals having no skew and multiphase signals having some skew, respectively. Referring to FIG. 1, second, third, and fourth clock signals CK1, CK2, and CK3 have exactly 90-degree, 180-degree and 270-degree phase differences, respectively, from a first clock signal CK0. Accordingly, there is no skew among the multiphase signals CK0 through CK3. In this case, 4-bit data D<3:0> can be input or output per clock cycle T and the four bits have the same timing, that is, the period of each bit is T/4. In contrast, referring to FIG. 2, the second, third, and fourth clock signals CK1, CK2, and CK3 do not have exactly 90-degree, 180-degree and 270-degree phase differences, respectively, from the first clock signal CK0. Accordingly, the periods of individual bits in the 4-bit data D<3:0>, which are input/output during a single clock cycle, are different from one another. In other words, the period of one or more bits may be longer than T/4 and the period of other bit(s) may be shorter than T/4.

The phase skew between multiphase signals may generate jitter in the output data and reduce the timing margin of a period in which the bit may be accurately sampled. As a result, it may be difficult to input/output data at high speed. In other words, the phase skew may hinder high-speed operation.

SUMMARY

Some embodiments of the present invention provide phase correction circuits and methods that may be used to reduce phase skew between multiphase signals.

According to some embodiments of the present invention, a phase correction circuit is provided that corrects phase skew between multiphase clock signals to generate skew-corrected clock signals. The phase correction circuit includes a phase corrector, a replication output buffer, a phase detector, and a controller. The phase corrector generates skew-corrected first and second clock signals that correct a duty cycle of a first clock signal, a duty cycle of a second clock signal and phase skew between the first and second clock signals. The replication output buffer outputs replication data in response to the skew-corrected first and second clock signals. The phase detector detects a phase error in data output from the replication output buffer to generate a detection signal. The controller controls the phase corrector in response to the detection signal. The replication data has a predetermined pattern to correct the duty cycles of the first and second clock signals and the phase skew between the first and second clock signals.

The phase correction circuit may be part of a semiconductor device that also includes a data output buffer that outputs data in synchronization with the skew-corrected clock signals. The replication output buffer may have the same structure as a data output buffer.

The phase correction circuit may also include a clock signal generator that is configured to generate the first and second clock signals in response to a reference clock signal. This clock signal generator may also be configured to generate a third clock signal which is offset in phase from the first clock signal by 180 degrees and a fourth clock signal which is offset in phase from the second clock signal by 180 degrees in response to the reference clock signal. The replication output buffer may include a multiplexer configured to multiplex the replication data in response to the first through fourth skew-corrected clock signals, and an output driver configured to drive an output signal of the multiplexer. The phase detector may include an integrator that is configured to integrate an output signal of the output driver, and a comparator that is configured to generate the detection signal based on the output from the integrator. The phase detector may be used in common for duty cycle correction and quadrature-phase skew correction with respect to the first through fourth clock signals.

According to other embodiments of the present invention, a phase correction method for multiphase clock signals is provided. The phase correction method includes correcting a duty cycle of a first clock signal using a first replication data pattern, correcting a duty cycle of a second clock signal using a second replication data pattern, and correcting phase skew between the first and second clock signals using a third replication data pattern to provide skew-corrected first and second clock signals.

The skew-corrected first and second clock signals may be separated in phase by 90 degrees, and the method may also include generating a skew-corrected third clock signal and a skew-corrected fourth clock signal which are separated in phase by 180 degrees from the first and second clock signals, respectively.

Correcting the duty cycle of the first clock signal may include initializing a first register value, generating the first replication data pattern, outputting the first replication data pattern in synchronization with the first thorough fourth clock signals using a replication output buffer, integrating data output from the replication output buffer using an integrator and updating the first register value based on a result of the integration, and correcting the duty cycle of the first clock signal and a duty cycle of the third clock signal based on the updated first register value. Correcting the duty cycle of the second clock signal may include initializing a second register value, generating the second replication data pattern, outputting the second replication data pattern in synchronization with the first through fourth clock signals using the replication output buffer, integrating data output from the replication output buffer using the integrator and updating the second register value based on a result of the integration, and correcting the duty cycle of the second clock signal and a duty cycle of the fourth clock signal based on the updated second register value. Correcting the phase skew may include initializing a third register value, generating the third replication data pattern, outputting the third replication data pattern in synchronization with the first through fourth clock signals using the replication output buffer, integrating data output from the replication output buffer using the integrator and updating the third register value based on a result of the integration, and correcting the phase skew between the first clock signal and the second clock signal based on the updated third register value.

According to further embodiments of the present invention, a phase correction method for multiphase clock signals includes generating a first clock signal and a second clock signal, which have a 90-degree phase difference from each other; correcting a duty cycle of the first clock signal, a duty cycle of the second clock signal, and phase skew between the first and second clock signals and generating skew-corrected first and second clock signals; distributing the skew-corrected first and second clock signals to an output buffer and to a replication output buffer which has the same structure as the output buffer; detecting a duty cycle error in the first and second clock signals and the phase skew between the first and second clock signals based on the skew-corrected first and second clock signals distributed to the replication output buffer; and performing duty cycle correction and phase skew correction with respect to the first and second clock signals based on a result of the detection.

According to additional embodiments of the present invention, phase correction circuits are provided that include a controller, a phase corrector, a buffer and a phase detector. The controller may be configured to output one or more first control signals in response to a second control signal. The phase corrector may receive a plurality of clock signals, and may be configured to generate a plurality of skew-corrected clock signals in response to the one or more first control signals and the received plurality of clock signals. The buffer may be configured to output data in response to the plurality of skew-corrected clock signals. The phase detector may be configured to detect a phase error in data output from the buffer to generate the second control signal. This phase correction circuit may be further configured to correct a duty cycle of each of the plurality of clock signals.

Pursuant to still further embodiments of the present invention, methods of correcting phases of a first plurality of clock signals are provided in which the first plurality of clock signals are passed through a phase corrector to provide a second plurality of clock signals. A duty cycle error in a first subset of the second plurality of clock signals is detected and then corrected using a phase detector. A duty cycle error in a second subset of the second plurality of clock signals is detected and then corrected using the phase detector. A quadrature phase skew between at least some of the second plurality of clock signals is detected and then corrected using the phase detector.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
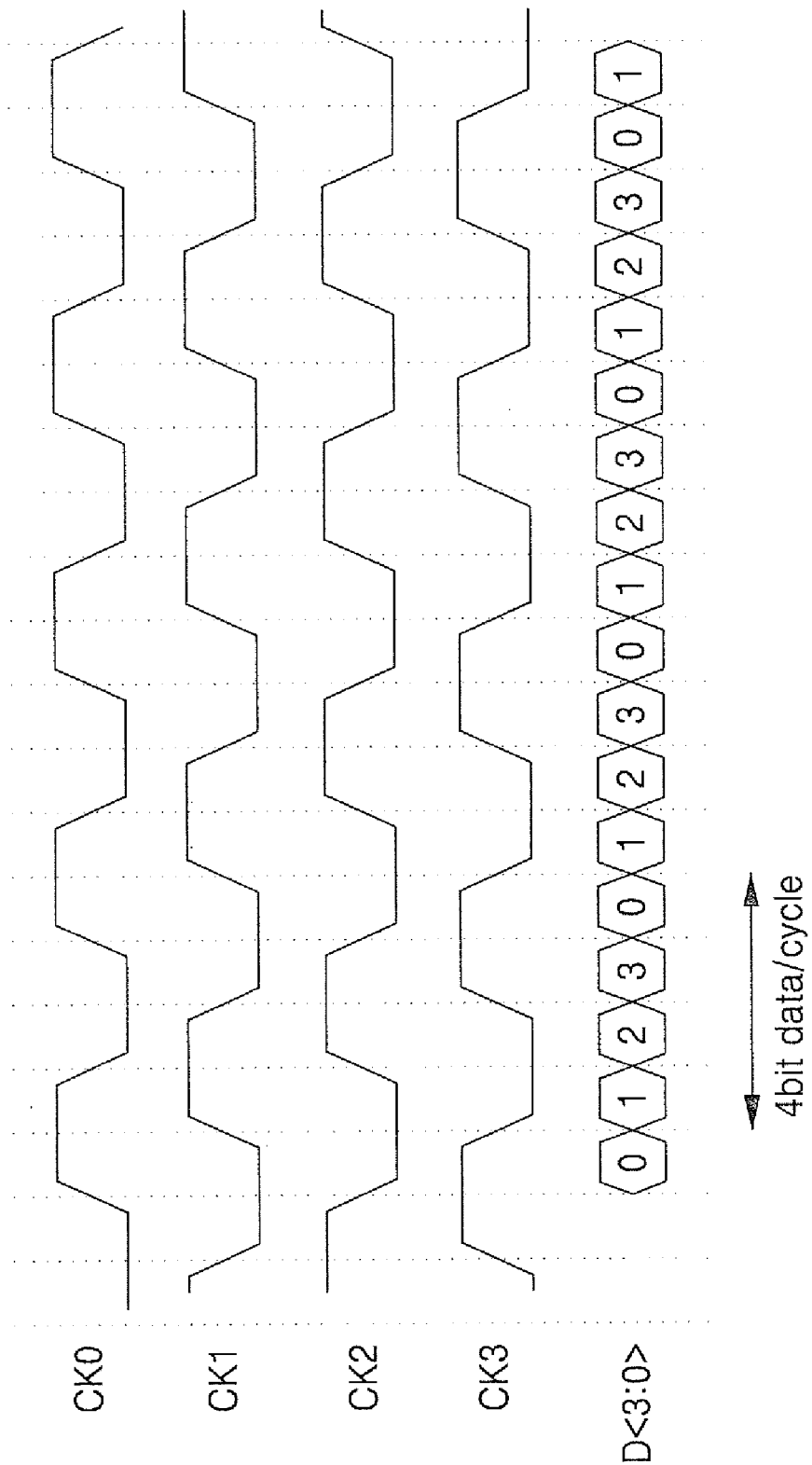
FIGS. 1 and 2 illustrate multiphase signals having no skew and multiphase signals having some skew, respectively.
Figure 2:
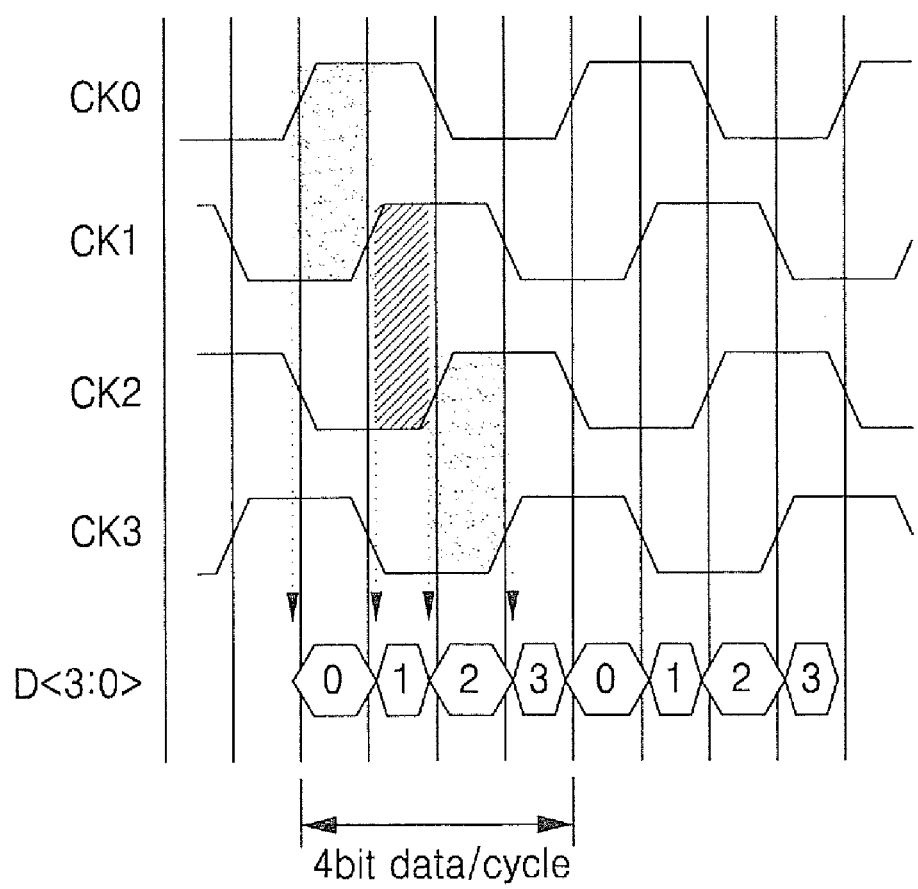

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the present disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 3:
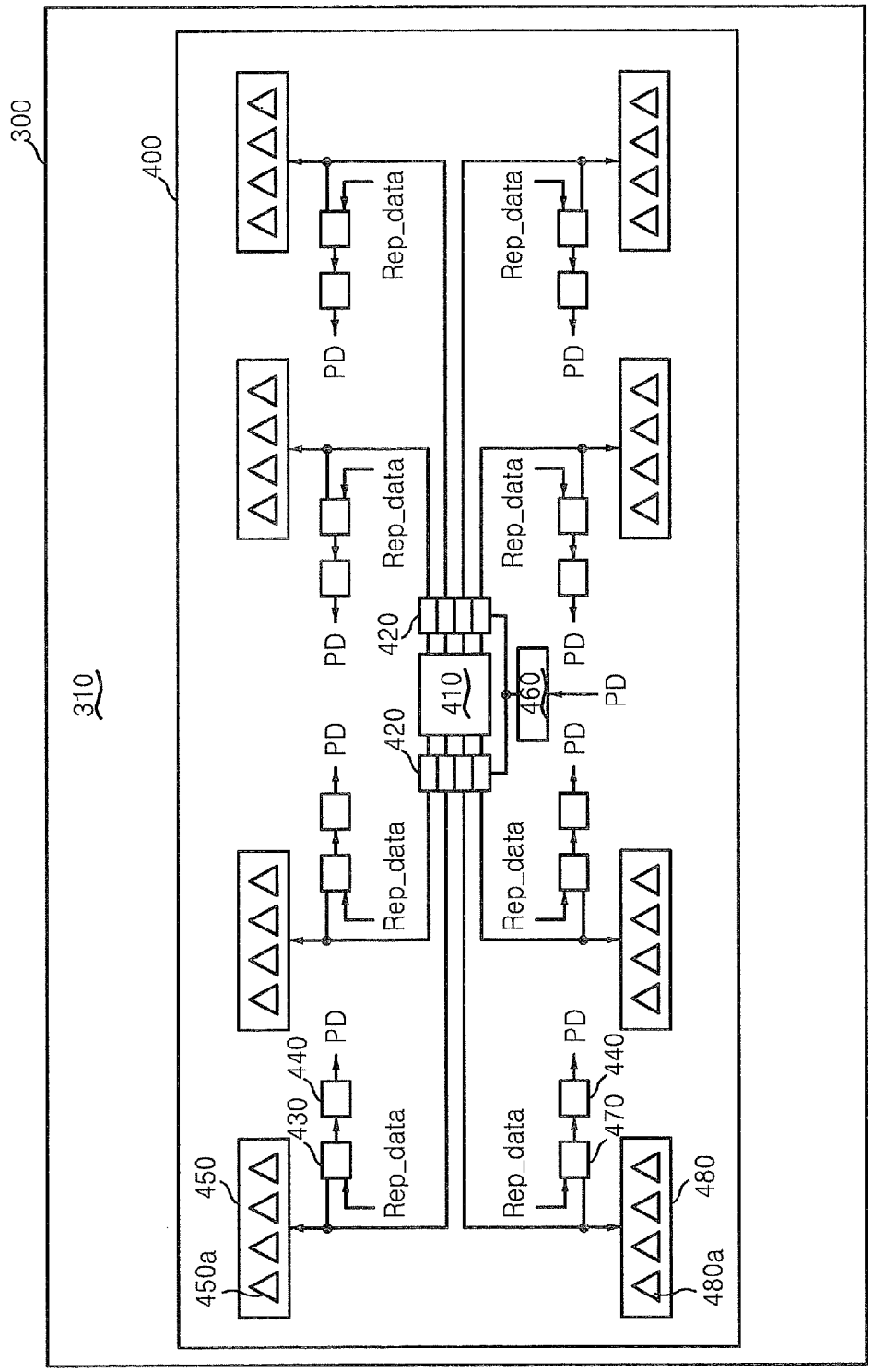
FIG. 3 is a block diagram of a semiconductor memory device according to some embodiments of the present invention.

FIG. 3 is a block diagram of a semiconductor memory device 300 according to some embodiments of the present invention. The semiconductor memory device 300 includes a memory cell core block 310 and a logic and input/output block 400. The memory cell core block 310 includes a memory cell array.

The logic and input/output block 400 includes a phase correction circuit and an input/output circuit. The phase correction circuit includes a clock signal generator 410, a phase corrector 420, a replication output buffer 430, a phase detector 440, and a controller 460. The phase correction circuit may additionally include a replication multiplexer 470, which is similar to the replication output buffer 430, for a receiving terminal. The input/output circuit includes a plurality of receivers 480 and a plurality of output buffers 450.

Figure 4:
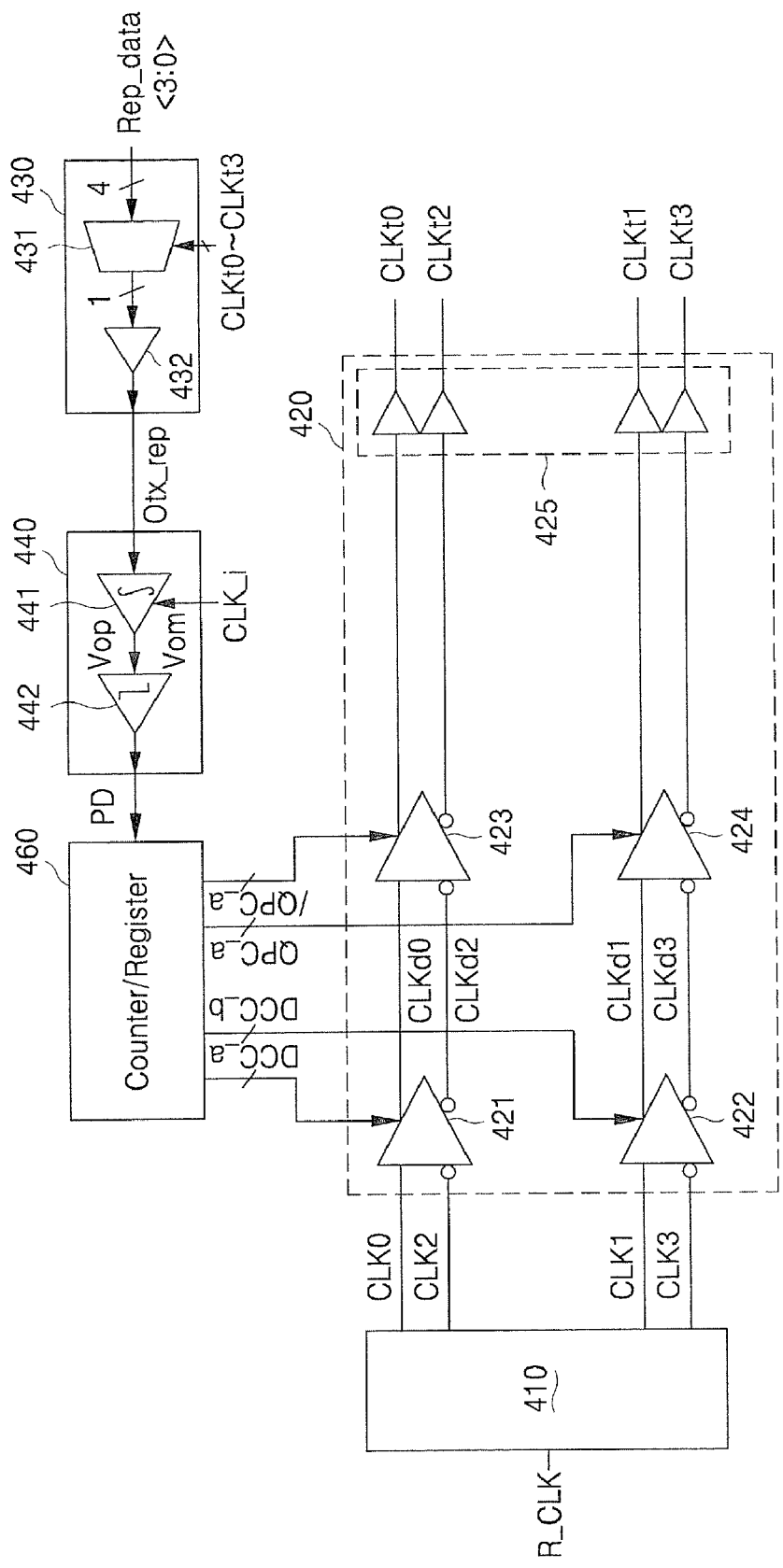
FIG. 4 is a block diagram of a phase correction circuit according to some embodiments of the present invention.

FIG. 4 is a more detailed block diagram of a phase correction circuit according to some embodiments of the present invention. Referring to FIGS. 3 and 4, the clock signal generator 410 generates a plurality of clock signals having different phases, i.e., multiphase clock signals. For instance, the clock signal generator 410 may receive a reference clock signal R_CLK and generate clock signals, which are synchronized with the reference clock signal R_CLIK, and which have predetermined phase differences (e.g., 90, 180, and 270 degrees, respectively) from the reference clock signal R_CLK. The clock signal generator 410 may be implemented, for example, by a phase-locked loop (PLL) circuit or a delay-locked loop (DLL) circuit. The reference clock signal R_CLK may be a clock signal which is input from an external source.

According to some embodiments of the present invention, the clock signal generator 410 generates first through fourth clock signals CLK0, CLK1, CLK2, and CLK3 having phase differences of 0, 90, 180, and 270 degrees, respectively, from the reference clock signal R_CLK. It will be appreciated that in other embodiments, different numbers of clock signals and/or different phase differences may be generated.

The phase corrector 420 corrects phase skew of the first through fourth clock signals CLK0 through CLK3 in response to digital control signals output from the controller 460. The phase corrector 420 outputs skew-corrected clock signals CLKt0, CLKt1, CLKt2, and CLKt3, which are distributed by a phase distribution tree to the output buffers 450 and the receivers 480. The phase distribution tree is a signal line which transmits the skew-corrected clock signals CLKt0 through CLKt3 to the output buffers 450 and the receivers 480. In addition, the skew-corrected clock signals CLKt0 through CLKt3 are also input to the replication output buffer 430 and the replication multiplexer 470.

According to some embodiments of the present invention, four unit output buffers 450a are grouped into a single output buffer 450. A phase corrector 420, a replication output buffer 430, and a phase detector 440 are provided for each output buffer 450. In addition, four unit receivers 480a are grouped into a single receiver 480. A phase corrector 420, a replication multiplexer 470, and a phase detector 440 are provided for each receiver 480. The clock signal generator 410 and the controller 460 are provided in common. However, it is apparent that in further embodiments of the present invention different configurations of elements may be used than is shown in FIG. 3.

Figure 5:
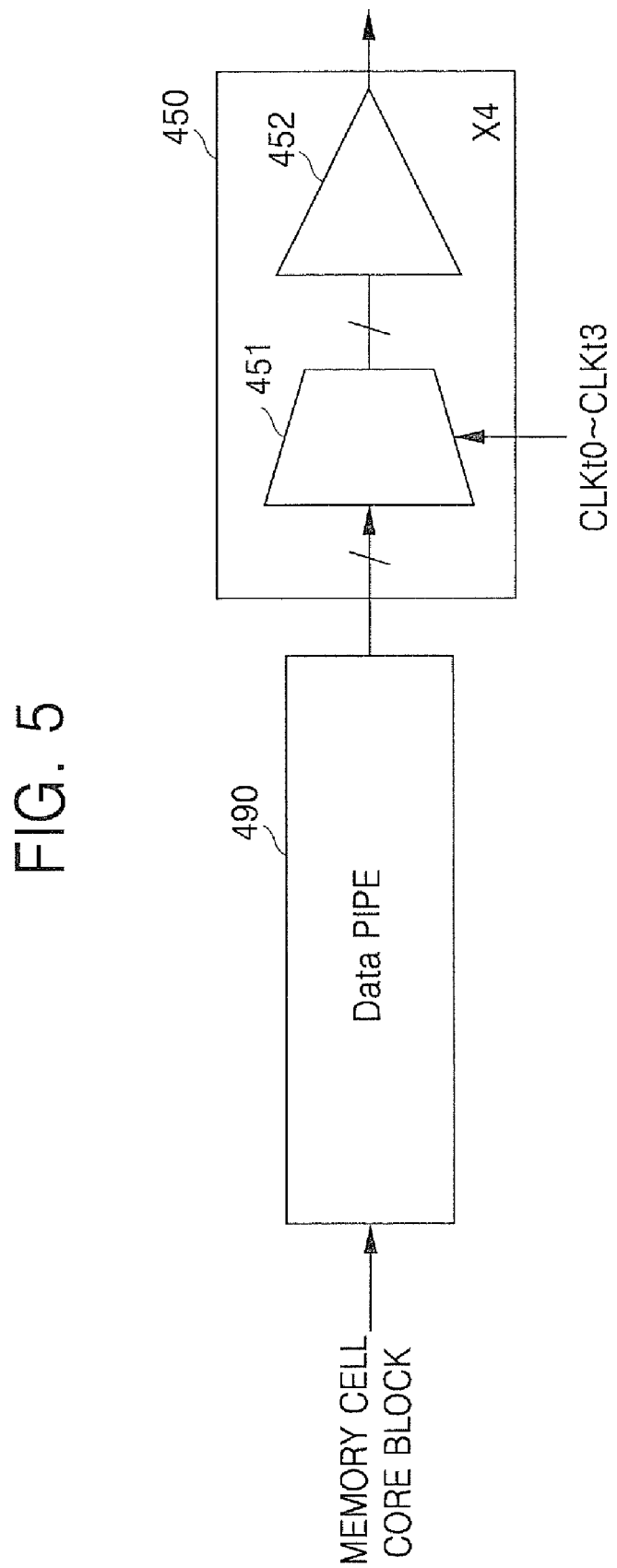
FIG. 5 is a schematic block diagram illustrating a data output path of a semiconductor memory device according to some embodiments of the present invention.

FIG. 5 is a schematic block diagram illustrating a data output path of a semiconductor memory device according to some embodiments of the present invention. Referring to FIG. 5, data output from the memory cell core block is output from the device through a data pipe line circuit 490 and an output buffer 450. The data pipe line circuit 490 aligns or delays data output from the memory cell core block as needed and transmits the data to the output buffer 450. The output buffer 450 includes a multiplexer 451 and an output driver 452. The multiplexer 451 receives the data from the data pipe line circuit 490 and outputs the data in synchronization with the skew-corrected clock signals CLKt0 through CLKt3. The output driver 452 drives current or voltage in response to an output signal of the multiplexer 451, so that the output signal is transmitted to an external destination through a pad.

Referring to FIGS. 3-5, the replication output buffer 430 receives replication data Rep_data and the skew-corrected clock signals CLKt0 through CLKt3 and outputs the replication data Rep_data in synchronization with the skew-corrected clock signals CLKt0 through CLKt3. The replication output buffer 430 includes a replication multiplexer 431 and a replication output driver 432. The structure of the replication output buffer 430 may be similar to the structure of the output buffer 450. The replication multiplexer 431 and the replication output driver 432 may, as discussed above, have substantially the same characteristics as the multiplexer 451 and the output driver 452 that are provided in each output buffer 450.

The replication data Rep_data is generated to correct phase skew of the first through fourth clock signals CLK0 through CLK3. The replication data Rep_data may have a predetermined pattern. A circuit (not shown) for generating the replication data Rep_data may also be provided.

The replication multiplexer 470 may have a stricture similar to that of the replication output buffer 430. However, while the replication output buffer 430 includes the replication multiplexer 431 and the replication output driver 432, the replication multiplexer 470 may include only a multiplexer, which outputs the replication data Rep_data in synchronization with the skew-corrected clock signals CLKt0 through CLKt3, without a driver circuit.

The phase detector 440 detects a phase error in data output from the replication output buffer 430 or the replication multiplexer 470 and generates a detection signal PD. The detection signal PD is fed back to the controller 460.

The controller 460 outputs digital control signals for controlling the phase corrector 420 using the detection signal PD received from the phase detector 440. The phase corrector 420 corrects the phase skew of the first through fourth clock signals CLK0 through CLK3 in response to the digital control signals output from the controller 460.

Hereinafter, methods according to embodiments of the present invention of correcting the phase skew of the multiphase clock signals CLK0 through CLK3 using the replication output buffer 430 will be described. These methods may be applied in the same manner to correct the phase skew of the multiphase clock signals CLK0 through CLK3 using the replication multiplexer 470. These methods are primarily explained with reference to FIGS. 3 and 4.

As shown in FIG. 4, the phase corrector 420 includes a first duty cycle corrector 421, a second duty cycle corrector 422, a first quadrature-phase corrector 423, a second quadrature-phase corrector 424, and a clock signal buffer 425.

The first duty cycle corrector 421 corrects duty cycles of the first and third clock signals CLK0 and CLK2 in response to a first duty cycle correction (DCC) signal DCC_a. The output signals, i.e., CLKd0 and CLKd2 have a duty ratio of 50%, at which a high level period is the same as a low level period, due to the operation of the first duty cycle corrector 421. The second duty cycle corrector 422 corrects duty cycles of the second and fourth clock signals CLK1 and CLK3 in response to a second DCC signal DCC_b. The output signals, i.e., CLKd1 and CLKd3 have a duty ratio of 50%, at which a high level period is the same as a low level period, due to the operation of the second duty cycle corrector 422.

The first quadrature-phase corrector 423 corrects quadrature-phase skew of duty-corrected first and third clock signals CLKd0 and CLKd2 in response to a first quadrature phase correction (QPC) signal /QPC_a. The first quadrature phase corrector 423 outputs skew-corrected clock signals CLKt0 and CLKt2. The second quadrature-phase corrector 424 corrects quadrature-phase skew of duty-corrected second and fourth clock signals CLKd1 and CLKd3 in response to a second QPC signal QPC_a. The second quadrature phase corrector 424 outputs skew-corrected clock signals CLKt1 and CLKt3.

The quadrature-phase skew between the quadrature signals CLKt0 and CLKt1 is corrected so that signals CLKt0 and CLKt1 have a 90-degree phase difference from each other. The quadrature-phase skew between the quadrature signals CLKct2 and CLKt3 is corrected so that the signals CLKt2 and CLKt3 have a 90-degree phase difference from each other. Accordingly, when the duty cycles of the first through fourth clock signals CLK0 through CLK3 are accurately corrected by the first and second duty cycle correctors 421 and 422 and the quadrature-phase skew of the first through fourth clock signals CLK0 through CLK3 is corrected by the first and second quadrature-phase correctors 423 and 424, clock signals CLKt0 through CLKt3 output from the clock signal buffer 425 each may have a 90-degree phase difference from an adjacent clock signal CLKt0 through CLKt3.

The first and second DCC signals DCC_a and DCC_b and the first and second QPC signals /QPC_a and QPC_a may be digital control signals output from the controller 460. The first QPC signal /QPC_a is an inverted signal of the second QPC signal QPC_a.

The signals output from the first and second quadrature-phase correctors 423 and 424, i.e., the skew-corrected clock signals CLKt0 through CLKt3 are input to the replication output buffer 430 and the output buffer 450 (FIG. 5). The signals output from the first and second quadrature-phase correctors 423 and 424, i.e., the skew-corrected clock signals CLKt0 through CLKt3 may also be input to the replication multiplexer 470 and the receiver 480. The description below will focus on operation of the replication output buffer 430 and the output buffer 450. As operation of the replication multiplexer 470 and the receiver 480 is similar, a detailed description thereof will be omitted.

The replication output buffer 430 receives the replication data Rep_data and outputs the replication data Rep_data in synchronization with the skew-corrected clock signals CLKt0 through CLKt3 as a signal Otx-Rep. As described above, the replication data Rep_data is generated for phase skew correction and may have a predetermined pattern. For instance, the replication data Rep_data may be 4-bit data Rep_data<3:0> which has a value of "0011" or "1100" in a first DCC mode, a value of "1001" or "0110" in a second DCC mode, and a value of "1010" or "0101" in a QPC mode. In the first DCC mode, the duty cycles of the first and third clock signals CLK0 and CLK2 are corrected. In the second DCC mode, the duty cycles of the second and fourth clock signals CLK1 and CLK3 are corrected. In the QPC mode, quadrature-phase skew is corrected.

Figure 6:
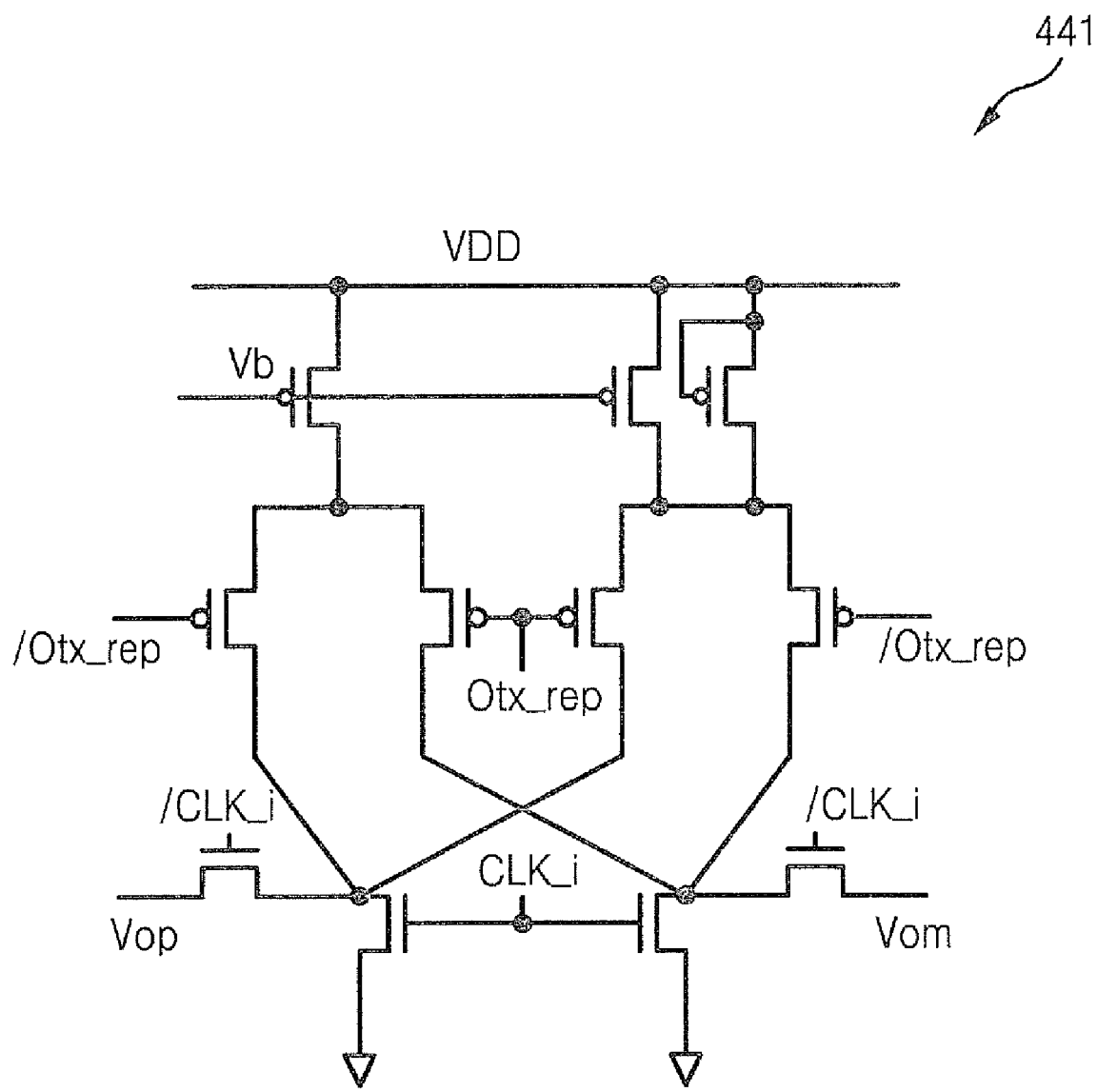
FIG. 6 is a circuit diagram of an integrator illustrated in FIG. 4, according to some embodiments of the present invention.

The phase detector 440 integrates the output data Otx_rep from the replication output buffer 430 and generates the detection signal PD based on a result of the integration. The phase detector 440 may include an integrator 441 and a comparator 442. FIG. 6 is a circuit diagram of an implementation of an integrator 441 according to some embodiments of the present invention.

Referring to FIG. 6, the integrator 441 integrates a difference between the output data Otx_rep from the replication output buffer 430 and an inverted output data /Otx_rep according to the cycle of an integration clock signal CLK_i. The integration clock signal CLK_i may comprise, for example, a frequency-divided signal (e.g., a ½, ¼, or ⅛ frequency-divided signal) of one of the first through fourth clock signals CLK0 through CLK3.

The integrator 441 outputs the result of the integration during a single cycle of the integration clock signal CLK_i as differential output signals Vop and Vom. In detail, the integrator 441 integrates the differences between the output data Otx_rep and the inverted output data /Otx_rep during half of the single cycle of the integration clock signal CLK_i and performs equalization during the remaining half of the single cycle. The integration and equalization procedure is repeated at each cycle of the integration clock signal CLK_i.

When the duty cycle of the output data Otx_rep of the replication output buffer 430 is greater than 50%, the integrated value output from the integrator 441 (i.e., Vop-Vom) is greater than 0. When the duty cycle of the output data Otx_rep is 50%, the integrated value is 0. When the duty cycle of the output data Otx_rep is less than 50%, the integrated value is less than 0.

The differential output signals Vop and Vom of the integrator 441 are input to the comparator 442. The comparator 442 generates a down signal as the detection signal PD when the integrated value ("Vop-Vom") is greater than 0 (i.e., when Vop is greater than Vom) and generates an up signal as the detection signal PD when the integrated value is less than 0 (i.e., when Vop is less than Vom).

The controller 460 may include a counter (not shown) and registers (not shown) which correspond to each of the modes (i.e., the first DCC mode, the second DCC mode, and the QPC mode). A single counter may be used in common in all modes and a register may be provided for each mode.

The counter increases or decreases a value of the register corresponding to the current mode in response to the output signal (i.e., the detection signal PD or the up/down signal) from the comparator 442. For instance, in the first DCC mode, the counter decreases a value of a corresponding register (hereinafter, referred to as a first DCC register) by one step in response to the down signal and increases the value of the first DCC register by one step in response to the up signal.

The value stored in each register may be a binary digital code comprised of a plurality of bits (e.g., 5 bits). Each register value may be input to the phase corrector 420 as a digital control signal. For instance, a value of the first DCC register is input to the first duty cycle corrector 421 as the first DCC signal DCC_a, a value of a second DCC register is input to the second duty cycle corrector 422 as the second DCC signal DCC_b, a value of a QPC register is input to the second quadrature-phase corrector 424 as the second QPC signal QPC_a, and an inverted signal of the value of the QPC register is input to the first quadrature-phase corrector 423.

Figure 7:
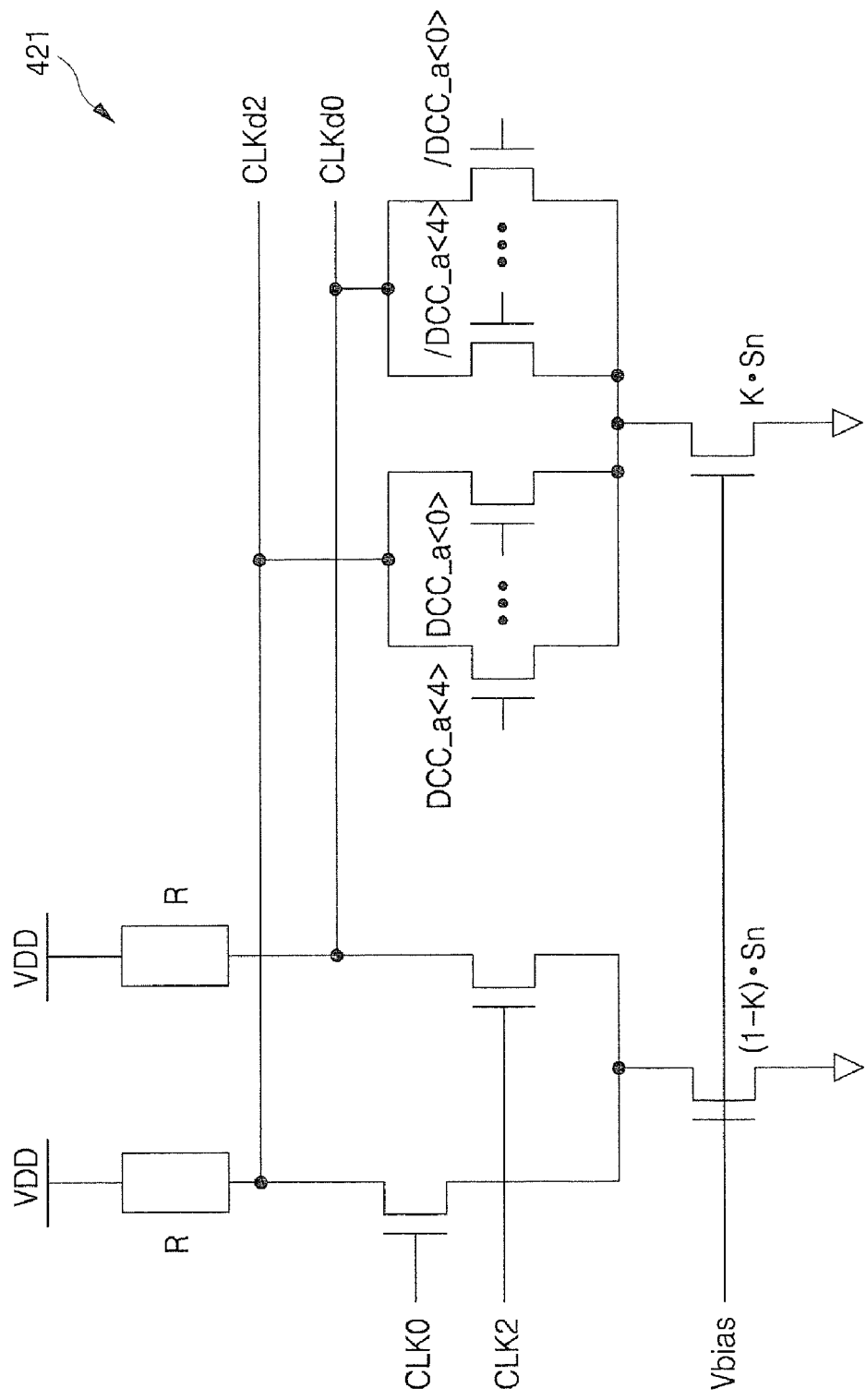
FIG. 7 is a circuit diagram of a duty cycle corrector illustrated in FIG. 4, according to some embodiments of the present invention.

FIG. 7 is a circuit diagram of an implementation of the first duty cycle corrector 421 according to some embodiments of the present invention. The second duty cycle corrector 422 can be implemented, for example, in a similar manner as the first duty cycle corrector 421.

Referring to FIG. 7, the duty cycle corrector 421 may be implemented by a differential amplifier which includes a pair of transistors operating in response to the first and third clock signals CLK0 and CLK2, a load resistor R, and a bias transistor operating in response to a bias voltage Vbias. The duty cycle corrector 421 may further include transistors which are respectively connected to output terminals in parallel and operate in response to corresponding bits, respectively, in the first DCC signal DCC_a<4:0>. Accordingly, the duty cycles of the clock signals CLKd0 and CLKd2 output from the output terminals of the duty cycle corrector 421 may be controlled by the combination of bits in the first DCC signal DCC_a<4:0>.

Figure 8:
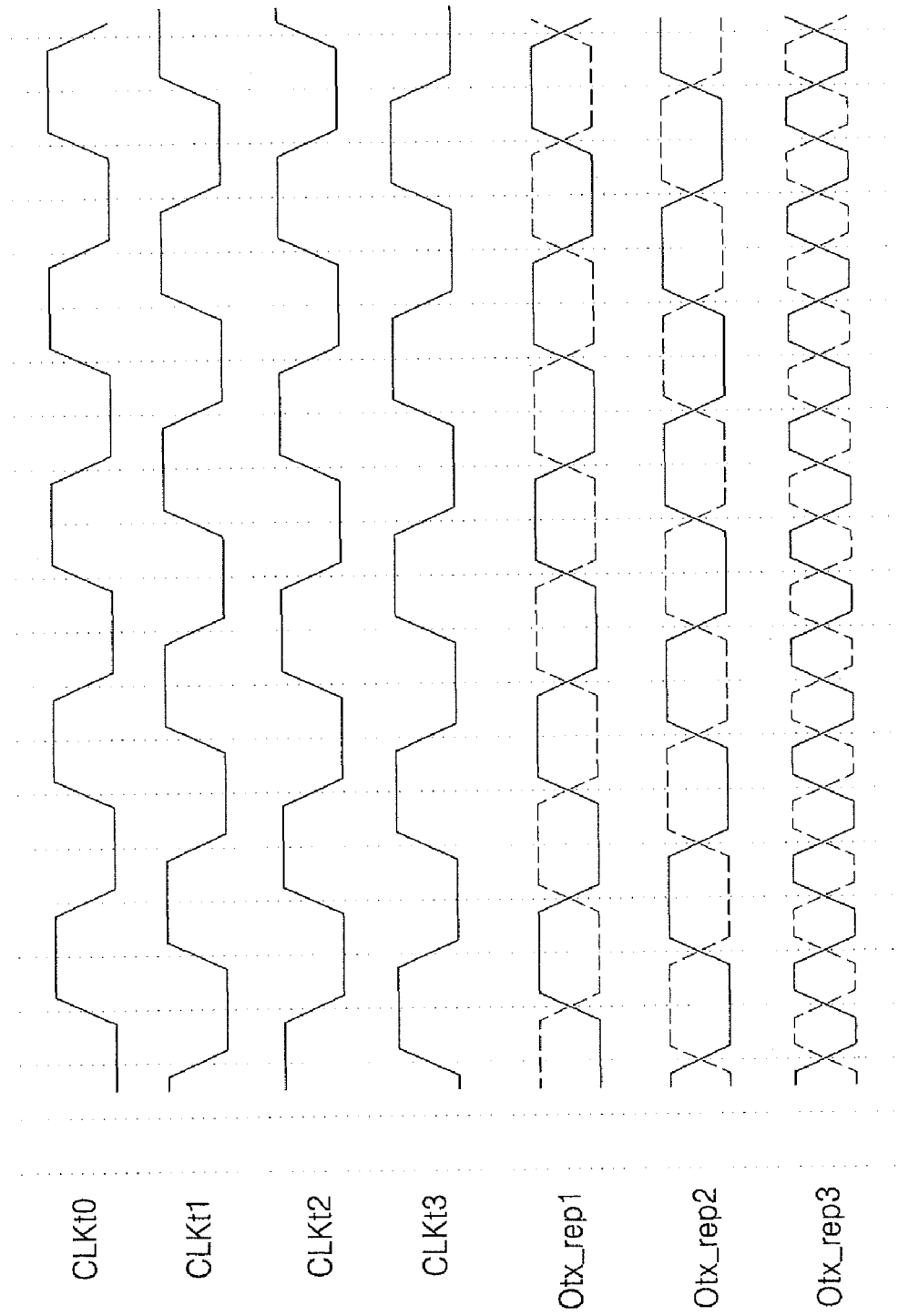
FIG. 8 is a signal timing chart of the phase correction circuit illustrated in FIG. 4, according to some embodiments of the present invention.
Figure 9:
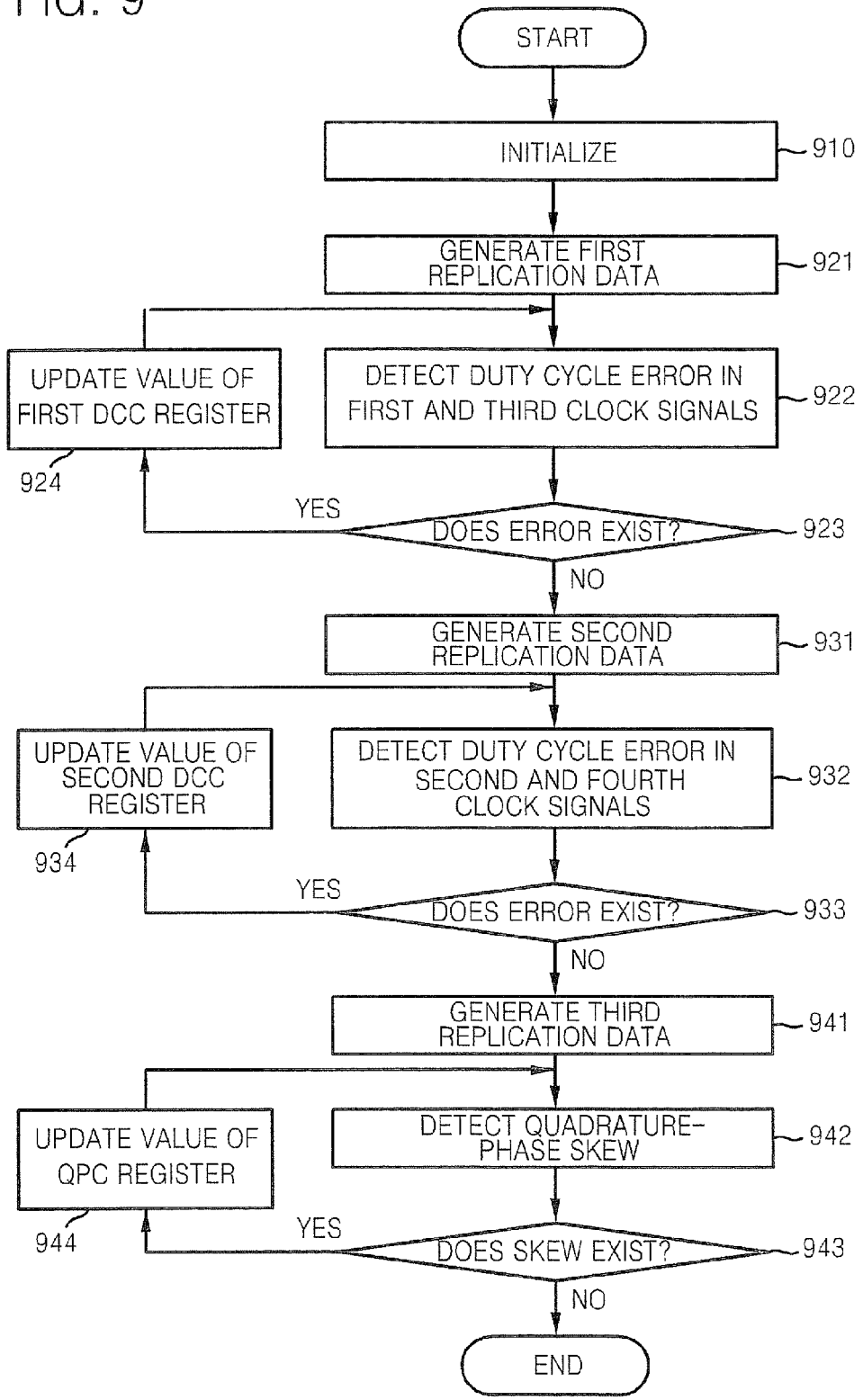
FIG. 9 is a flowchart of a phase correction method according to some embodiments of the present invention.

FIG. 8 is a signal timing chait of the phase correction circuit illustrated in FIG. 4, according to some embodiments of the present invention. FIG. 9 is a flowchart of phase correction methods according to some embodiments of the present invention. These phase correction methods will be described with reference to FIGS. 4, 8, and 9 below.

In operation 910, the registers in the controller 460 are initialized. The first DCC mode is performed in operations 921 through 924. In particular, in operation 921, first replication data for the first DCC mode is generated. In addition, the first through fourth clock signals CLK0 through CLK3 are generated by the clock signal generator 410. The phase corrector 420 generates the output clock signals CLKt0 through CLKt3 in response to initial values of the respective registers. The replication output buffer 430 outputs first replication data in synchronization with the output clock signals CLKt0 through CLKt3 from the phase corrector 420. The waveform of a signal Otx_rep1 output by the replication output buffer 430 when the first replication data is "0011" is illustrated by a solid line in FIG. 8 and the waveform of an inverted signal/Otx_rep1 of the signal Otx_rep1 is illustrated by a dotted line in FIG. 8. At this time, the output signal Otx_rep1 of the replication output buffer 430 and the first output clock signal CLKt0 have the same waveform, and the inverted signal/Otx_rep1 and the third output clock signal CLKt2 have the same waveform. Accordingly, the output signal Otx_rep1 of the replication output buffer 430 reflects duty cycle errors in the first and third output clock signals CLKt0 and CLKt2.

In operation 922, the output signal Otx_rep1 of the replication output buffer 430 is integrated by the integrator 441 of the phase detector 440 to detect any duty cycle error in the first and third output clock signals CLKt0 and CLKt2. When it is detected that a duty cycle error exists in operation 923, the value of the first DCC register is updated in operation 924.

In particular, the phase detector 440 integrates the output signal Otx_rep1 of the replication output buffer 430 according to the cycle of the integration clock signal CLK_i and generates the up or down signal based on a result of the integration. Then, the counter increases or decreases the value of a current register, i.e., the first DCC register, in response to the detection signal PD output from the phase detector 440. In other words, the value of the first DCC register is updated according to the output signal PD of the phase detector 440. The values of the remaining registers remain unchanged.

The first duty cycle corrector 421 corrects the duty cycles of the first and third clock signals CLK0 and CLK2 in response to the updated value (i.e., the first DCC signal DCC_a) of the first DCC register. The output clock signals CLKt0 through CLKt3 of the phase corrector 420 are newly input to the replication output buffer 430. Operations 922 through 924 are repeated until no duty cycle error is detected in the signal Otx_rep1 output from the replication output buffer 430 so that the value of the first DCC register that eliminates a duty cycle error of the first and third clock signals CLK0 and CLK2, is determined.

Once the value of the first DCC register that corrects for the duty cycle error in the first and third clock signals CLK0 and CLK2 has been determined such that no duty cycle error exists in the first and third output clock signals CLKt0 and CLKt2, the first DCC mode is terminated and the second DCC mode is performed.

In operation 931, second replication data (e.g., "1001") for the second DCC mode is generated.

The phase corrector 420 generates the output clock signals CLKt0 through CLKt3 in response to the value of the first DCC register that determined in the first DCC mode and to the initial values contained in the remaining registers. The replication output buffer 430 outputs the second replication data in synchronization with the output clock signals CLKt0 through CLKt3 of the phase corrector 420.

The waveform of a signal Otx_rep2 output by the replication output buffer 430 when the second replication data is "1001" is illustrated by a solid line in FIG. 8 and the waveform of an inverted signal/Otx_rep2 of the signal Otx_rep2 is illustrated by a dotted line in FIG. 8. At this time, the output signal Otx_rep2 of the replication output buffer 430 and the second output clock signal CLKt1 have the same waveform, and the inverted signal/Otx_rep2 and the fourth output clock signal CLKt3 have the same waveform. Accordingly, the output signal Otx_rep2 of the replication output buffer 430 reflects duty cycle errors in the second and fourth output clock signals CLKt1 and CLKt3.

In operation 932, the output signal Otx_rep2 of the replication output buffer 430 is integrated by the integrator 441 of the phase detector 440 to detect any duty cycle error in the second and fourth output clock signals CLKt1 and CLKt3. When it is detected that a duty cycle error exists in operation 933, the value of the second DCC register is updated in operation 934.

In particular, the phase detector 440 integrates the output signal Otx_rep2 of the replication output buffer 430 according to the cycle of the integration clock signal CLK_i and generates any up or down signal based on the integrated value. Then, the counter increases or decreases the value of a current register, i.e., the second DCC register, in response to the detection signal PD output from the phase detector 440. In other words, the value of the second DCC register is updated according to the output signal PD of the phase detector 440. The values of the remaining registers remain unchanged.

The second duty cycle corrector 422 corrects the duty cycles of the second and fourth clock signals CLK1 and CLK3 in response to the updated value (i.e., the second DCC signal DCC_b) of the second DCC register. The output clock signals CLKt0 through CLKt3 of the phase corrector 420 are newly input to the replication output buffer 430. Operations 932 through 934 are repeated until no duty cycle error is detected in the signal Otx_rep2 output from the replication output buffer 430 so that the value of the second DCC register that eliminates a duty cycle error of the second and fourth clock signals CLK1 and CLK3 is determined.

When no duty cycle error exists in the second and fourth output clock signals CLKt1 and CLKt3, the QPC mode is performed.

In operation 941, third replication data for the QPC mode is generated.

The phase corrector 420 generates the output clock signals CLKt0 through CLKt3 in response to the value of the first DCC register, which is determined in the first DCC mode, the value of the second DCC register, which is determined in the second DCC mode, and the initial value of the QPC register.

The waveform of a signal Otx_rep3 output by the replication output buffer 430 when the third replication data is "1010" is illustrated by a solid line in FIG. 8, and the waveform of an inverted signal of the signal Otx_rep2 is illustrated by a dotted line in FIG. 8. Referring to FIG. 8, the cycle of the output signal Otx_rep3 of the replication output buffer 430 is half of that of the first through fourth output clock signals CLKt0 through CLKt3 and the output signal Otx_rep3 reflects quadrature-phase skew between the first and second output clock signals CLKt0 and CLKt1 and quadrature-phase skew between the third and fourth output clock signals CLKt2 and CLKt3.

In operation 942, the output signal Otx_rep3 of the replication output buffer 430 is integrated by the integrator 441 of the phase detector 440 to detect quadrature-phase skew between the first and second clock signals CLKt0 and CLKt1 and the quadrature-phase skew between the third and fourth clock signals CLKt2 and CLKt3. If it is detected that quadrature-phase skew exists in operation 943, the value of the QPC register is updated in operation 944.

A procedure for determining a value of the QPC register using third replication data is similar to that for determining the values of the first and second DCC registers. Thus, a detailed description thereof will be omitted.

According to above-described methods, multiphase clock signals with reduced or no skew can be obtained. In the above description, the first DCC mode, the second DCC mode, and the QPC mode are sequentially performed. In some embodiments, the order of the first and second DCC modes may be changed.

As described above, according to some embodiments of the present invention, separate phase detectors are not required for the first and second DCC modes and the QPC mode. In other words, only a pair of an integrator and a comparator are needed to detect a phase error in multiphase signals. Since the phase detector can be used in common, the size of a circuit can be decreased and power consumption can be decreased. In addition, an offset of duty cycle error detection is the same as that of quadrature-phase skew detection. Accordingly, an offset between the duty cycle error detection and the quadrature-phase skew detection, which may occur when separate phase detectors are used, can be reduced, minimized or eliminated.

According to some embodiments of the present invention, phase information (i.e., duty cycle error information and quadrature-phase skew information) of multiple clock signals are detected from an output of a replication output buffer identical to a data output buffer, so that a static error that may occur in an output buffer can be corrected.

As described above, according to embodiments of the present invention, phase skew between multiphase clock signals can be effectively reduced or eliminated. In addition, a correction circuit for reducing phase skew can be embodied in hardware with a small area.

While the present invention has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. A phase correction circuit comprising:
    a phase corrector that is configured to generate skew-corrected first and second clock signals that correct a duty cycle of a first clock signal and a duty cycle of a second clock signal and correct phase skew between the first and second clock signals;
    a replication output buffer that is configured to receive replication data and to output the replication data in synchronization with the skew-corrected first and second clock signals;
    a phase detector that is configured to detect a phase error in data output from the replication output buffer and to generate a detection signal; and
    a controller that is configured to control the phase corrector in response to the detection signal,
    wherein the replication data has a predetermined pattern to correct the duty cycles of the first and second clock signals and the phase skew between the first and second clock signals, and
    wherein the replication output buffer comprises a multiplexer that is configured to multiplex the replication data in response to a plurality of signals including the skew-corrected first and second clock signals.

2. The phase correction circuit of claim 1, wherein the replication output buffer has the same structure as a data output buffer.

3. The phase correction circuit of claim 1, further comprising a clock signal generator that is configured to generate the first and second clock signals in response to a reference clock signal, wherein the clock signal generator is further configured to generate a third clock signal which is offset in phase from the first clock signal by 180 degrees and a fourth clock signal which is offset in phase from the second clock signal by 180 degrees in response to the reference clock signal.

4. The phase correction circuit of claim 3, wherein the phase corrector is further configured to generate and provide to the replication output buffer skew-corrected third and fourth clock signals that correct a duty cycle of the third clock signal, a duty cycle of the fourth clock signal and phase skew between the third and fourth clock signals, and wherein the replication output buffer further comprises:
    an output driver that is configured to drive an output signal of the multiplexer,
    wherein the plurality of signals include the third clock signal and the fourth clock signal.

5. The phase correction circuit of claim 4, wherein the phase detector comprises:
    an integrator that is configured to integrate an output signal of the output driver; and
    a comparator that is configured to generate the detection signal based on an output of the integrator.

6. The phase correction circuit of claim 5, wherein the phase detector is used to both correct the duty cycle and quadrature-phase skew with respect to the first through fourth clock signals.

7. The phase correction circuit of claim 1, wherein the replication data comprises:
    a first data pattern that is used for duty cycle correction of the first and third clock signals;
    a second data pattern that is used for duty cycle correction of the second and fourth clock signals; and
    a third data pattern that is used for quadrature-phase skew correction of the first and third clock signals and quadrature-phase skew correction of the second and fourth clock signals.

8. The phase correction circuit of claim 7, wherein the controller comprises:
    a first register, a second register, and a third register, each of which is configured to store a digital code comprised of a plurality of bits; and
    a counter that is configured to change a value of the first register in response to a phase detection signal that is generated based on the first data pattern, to change a value of the second register in response to a phase detection signal that is generated based on the second data pattern, and to change a value of the third register in response to a phase detection signal that is generated based on the third data pattern.

9. The phase correction circuit of claim 8, wherein the phase corrector comprises:

a first duty cycle corrector that is configured to correct duty cycles of the first and third clock signals in response to the digital code stored in the first register;

a second duty cycle corrector that is configured to correct duty cycles of the second and fourth clock signals in response to the digital code stored in the second register;

a first quadrature-phase corrector that is configured to correct quadrature-phase skew of signals output from the first duty cycle corrector in response to the digital code stored in the third register and to generate the skew-corrected first and third clock signals; and a second quadrature-phase corrector that is configured to correct quadrature-phase skew of signals output from the second duty cycle corrector in response to the digital code stored in the third register and to generate the skew-corrected second and fourth clock signals.

10. The phase correction circuit of claim 7, wherein the first data pattern is "0011" or "1100", the second data pattern is "1001" or "0110", and the third data pattern is "1010" or "0101".

11. The phase correction circuit of claim 1, wherein the first and second clock signals are multiphase clock signals, and wherein the phase correction circuit is in combination with a data output buffer that is configured to output data in synchronization with the skew-corrected first and second clock signals.

12. The phase correction circuit of claim 11, wherein the replication output buffer has the same structure as the data output buffer.

13. A phase correction method for multiphase clock signals, the phase correction method comprising:

detecting a first duty cycle error of a first clock signal using a first replication data pattern and correcting the first duty cycle error by updating a first register value;

detecting a second duty cycle error of a second clock signal using a second replication data pattern and correcting the second duty cycle error by updating a second register value; and correcting phase skew between the first and second clock signals using a third replication data pattern to provide skew-corrected first and second clock signals.

14. The phase correction method of claim 13, wherein the skew-corrected first and second clock signals are separated in phase by 90 degrees from each other, the method further comprising generating a skew-corrected third clock signal and a skew-corrected fourth clock signal which are separated in phase by 180 degrees from the first and second clock signals, respectively.

15. The phase correction method of claim 14, wherein correcting the duty cycle of the first clock signal comprises:

initializing a first register value;

generating the first replication data pattern;

outputting the first replication data pattern in synchronization with the first through fourth clock signals using a replication output buffer;

integrating data output from the replication output buffer using an integrator and updating the first register value based on a result of the integration; and correcting the duty cycle of the first clock signal and a duty cycle of the third clock signal based on the updated first register value, wherein correcting the duty cycle of the second clock signal comprises:

initializing a second register value;

generating the second replication data pattern;

outputting the second replication data pattern in synchronization with the first through fourth clock signals using the replication output buffer;

integrating data output from the replication output buffer using the integrator and updating the second register value based on a result of the integration; and correcting the duty cycle of the second clock signal and a duty cycle of the fourth clock signal based on the updated second register value, and wherein correcting the phase skew comprises:

initializing a third register value;

generating the third replication data pattern;

outputting the third replication data pattern in synchronization with the first through fourth clock signals using the replication output buffer;

integrating data output from the replication output buffer using the integrator and updating the third register value based on a result of the integration; and correcting the phase skew between the first clock signal and the second clock signal based on the updated third register value.

16. The phase correction method of claim 15, wherein the replication output buffer and the integrator are used in common for correcting the duty cycle of the first clock signal, correcting the duty cycle of the second clock signal, and correcting the phase skew between the first and second clock signals.

17. A phase correction method for multiphase clock signals, the phase correction method comprising:

generating a first clock signal and a second clock signal that is offset in phase from the first clock signal by approximately 90 degrees;

generating skew-corrected first and second clock signals that correct a duty cycle error in the first clock signal, a duty cycle error in the second clock signal, and phase skew between the first and second clock signals;

providing the skew-corrected first and second clock signals to an output buffer and to a replication output buffer which has the same structure as the output buffer;

detecting a duty cycle error in the first and second clock signals and the phase skew between the first and second clock signals based on the skew-corrected first and second clock signals distributed to the replication output buffer; and performing duty cycle correction and phase skew correction with respect to the first and second clock signals based on a result of the detection.

18. A phase correction circuit comprising:

a controller that is configured to output one or more first control signals in response to a second control signal;

a phase corrector that is configured to receive a plurality of clock signals and that is configured to generate a plurality of skew-corrected clock signals in response to the one or more first control signals and the received plurality of clock signals;

a buffer that is configured to receive replication data and to output the replication data in synchronization with the plurality of skew-corrected clock signals; and a phase detector that is configured to detect a phase error in data output from the buffer to generate the second control signal,
wherein the buffer comprises a multiplexer that is configured to multiplex the replication data in response to a plurality of signals including the skew-corrected first and second clock signals.

19. The phase correction circuit of claim 18, wherein the phase corrector is further configured to correct a duty cycle of each of the plurality of clock signals.

20. The phase correction circuit of claim 19, wherein the data has a predetermined pattern.

21. The phase correction circuit of claim 20, further comprising a clock signal generator that is configured to generate the plurality of clock signals in response to a reference clock signal.

22. The phase correction circuit of claim 21, in combination with a data output buffer, wherein the buffer and the data output buffer have the same structure.

23. The phase correction circuit of claim 18, wherein the phase detector comprises an integrator that receives an output signal of the buffer and a comparator that is configured to generate the detection signal based on an output of the integrator, and wherein the phase detector is used to correct the duty cycle and quadrature-phase skew with respect to each of the plurality of clock signals.

24. A method of correcting phases of a first plurality of clock signals, the method comprising:
    passing the first plurality of clock signals through a phase corrector to provide a second plurality of clock signals;
    detecting duty cycle error in a first subset of the second plurality of clock signals;
    correcting the duty cycle error in the first subset of the second plurality of clock signals by updating a first register value;
    detecting duty cycle error in a second subset of the second plurality of clock signals;
    correcting the duty cycle error in the second subset of the second plurality of clock signals by updating a second register value;
    detecting quadrature phase skew between at least some of the second plurality of clock signals; and
    correcting the detected quadrature phase skew using a third replication data pattern to provide skew-corrected first and second subsets of the second plurality of clock signals.

25. The method of claim 24, wherein correcting the duty cycle error in the first subset of the second plurality of clock signals using a phase detector comprises inputting a first data pattern into the phase detector in synchronization with the second plurality of clock signals to detect the duty cycle error and then adjusting the duty cycle of the first subset of the second plurality of clock signals to reduce the detected error, wherein correcting the duty cycle error in the second subset of the second plurality of clock signals using a phase detector comprises inputting a second data pattern into the phase detector in synchronization with the second plurality of clock signals to detect the duty cycle error and then adjusting the duty cycle of the second subset of the second plurality of clock signals to reduce the detected error, and wherein correcting the detected quadrature phase skew using the first phase detector comprises inputting a third data pattern into the phase detector in synchronization with the second plurality of clock signals to detect the quadrature phase skew and then adjusting the phases of at least some of the second plurality of clock signals to reduce the quadrature phase skew.

* * * * *